US008810046B2

(12) United States Patent
Ona et al.

(10) Patent No.: US 8,810,046 B2
(45) Date of Patent: Aug. 19, 2014

(54) SILICONE RESIN COMPOSITION, ENCAPSULATING LAYER, REFLECTOR, AND OPTICAL SEMICONDUCTOR DEVICE

(71) Applicants: Haruka Ona, Osaka (JP); Hiroyuki Katayama, Osaka (JP)

(72) Inventors: Haruka Ona, Osaka (JP); Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 31 days.

(21) Appl. No.: 13/653,813

(22) Filed: Oct. 17, 2012

(65) Prior Publication Data

US 2013/0099395 A1  Apr. 25, 2013

(30) Foreign Application Priority Data

Oct. 25, 2011  (JP) ................. 2011-234087

(51) Int. Cl.
*H01L 23/29* (2006.01)
*C08L 83/04* (2006.01)

(52) U.S. Cl.
USPC ........... 257/788; 257/791; 525/477; 525/478; 528/15; 528/31; 528/32

(58) Field of Classification Search
None
See application file for complete search history.

(56) References Cited

U.S. PATENT DOCUMENTS

| 2004/0054047 | A1 | 3/2004 | Lai et al. | |
| 2009/0225640 | A1 | 9/2009 | Manabe et al. | |
| 2012/0112211 | A1* | 5/2012 | Fujii et al. | 257/79 |
| 2012/0319154 | A1* | 12/2012 | Fujii et al. | 257/98 |
| 2013/0092973 | A1* | 4/2013 | Kondo et al. | 257/100 |
| 2013/0099395 | A1* | 4/2013 | Ona et al. | 257/791 |

FOREIGN PATENT DOCUMENTS

| EP | 2 319 888 A1 | | 5/2011 |
| JP | 2000-154252 A | | 6/2000 |
| JP | 2002-069191 A | | 3/2002 |
| JP | 2006-299150 | * | 11/2006 |
| JP | 2007-251122 | * | 9/2007 |
| JP | 2012-102167 A | | 5/2012 |
| WO | WO 2008/065787 | * | 6/2008 |
| WO | WO 2009/025017 | * | 2/2009 |

OTHER PUBLICATIONS

European Search Report issued in corresponding EP Application No. 12189406.7 dated Mar. 4, 2013.

* cited by examiner

*Primary Examiner* — Marc Zimmer
(74) *Attorney, Agent, or Firm* — Sughrue Mion, PLLC

(57) ABSTRACT

A silicone resin composition contains a cage octasilsesquioxane having a group represented by the following formula (1), an alkenyl group-containing polysiloxane containing an alkenyl group having a number of moles larger than that of a hydrosilyl group in the cage octasilsesquioxane, a hydrosilylation catalyst, and an organohydrogenpolysiloxane.

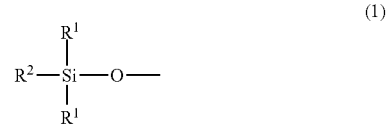

(where, in formula, $R^1$ represents a monovalent hydrocarbon group selected from a saturated hydrocarbon group and an aromatic hydrocarbon group. $R^2$ represents hydrogen or a monovalent hydrocarbon group selected from a saturated hydrocarbon group and an aromatic hydrocarbon group. The molar ratio of the monovalent hydrocarbon group:hydrogen in $R^2$ in the cage octasilsesquioxane as a whole is, as an average value, in the range of 6.5:1.5 to 5.5:2.5).

9 Claims, 1 Drawing Sheet

SILICONE RESIN COMPOSITION, ENCAPSULATING LAYER, REFLECTOR, AND OPTICAL SEMICONDUCTOR DEVICE

CROSS-REFERENCE TO RELATED APPLICATION

The present application claims priority from Japanese Patent Application No. 2011-234087 filed on Oct. 25, 2011, the contents of which are hereby incorporated by reference into this application.

BACKGROUND OF THE INVENTION

1. Field of the Invention

The present invention relates to a silicone resin composition, an encapsulating layer, a reflector, and an optical semiconductor device, to be specific, to a silicone resin composition, an encapsulating layer made from the silicone resin composition, a reflector containing the silicone resin composition, and an optical semiconductor device including the silicone resin composition, the encapsulating layer, and the reflector.

2. Description of Related Art

Conventionally, as an encapsulating material for encapsulating an optical semiconductor element such as a light emitting diode (LED), a silicone resin having an excellent transparency has been used. The silicone resin is in a liquid state at room temperature. The silicone resin is applied to the optical semiconductor element to be then cured by heating, so that the silicone resin encapsulates the optical semiconductor element.

In view of storage stability and handling ability, a silicone resin in a solid state at room temperature is also used. As the silicone resin in a solid state, for example, a silsesquioxane-containing polymer obtained by allowing a pentacyclo [9.5.1.1$^{3.9}$.1$^{5.15}$.1$^{7.13}$]octasiloxane to react with a 1,3-divinyltetramethyldisiloxane has been proposed (ref: for example, Japanese Unexamined Patent Publication No. 2000-154252).

Also, a polysiloxane obtained by allowing a hydrogenated octasilsesquioxane to react with a disilanol has been proposed (ref: for example, Japanese Unexamined Patent Publication No. 2002-69191).

The encapsulating materials proposed in Japanese Unexamined Patent Publications No. 2000-154252 and No. 2002-69191 are plasticized by heating to thus encapsulate the optical semiconductor element.

SUMMARY OF THE INVENTION

However, in view of improving heat resistance and durability, it has been required that a silicone resin in a solid state is plasticized by heating to be then cured. However, the encapsulating materials in Japanese Unexamined Patent Publications No. 2000-154252 and No. 2002-69191 have a disadvantage that they cannot be cured.

Also, the silicone resin has been required to be cured at relatively low temperature.

On the other hand, the encapsulating material is required to improve the flexibility so as to prevent damage to the optical semiconductor element.

It is an object of the present invention to provide a silicone resin composition having an excellent transparency and heat resistance, having both thermoplastic properties and thermosetting properties, capable of reducing a thermosetting temperature, and furthermore, having an excellent flexibility; an encapsulating layer made from the silicone resin composition; a reflector containing the silicone resin composition; and an optical semiconductor device including the silicone resin composition, the encapsulating layer, and the reflector.

A silicone resin composition of the present invention contains a cage octasilsesquioxane having a group represented by the following formula (1), an alkenyl group-containing polysiloxane containing an alkenyl group having a number of moles larger than that of a hydrosilyl group in the cage octasilsesquioxane, a hydrosilylation catalyst, and an organohydrogenpolysiloxane.

(1)

(where, in formula, $R^1$ represents a monovalent hydrocarbon group selected from a saturated hydrocarbon group and an aromatic hydrocarbon group. $R^2$ represents hydrogen or a monovalent hydrocarbon group selected from a saturated hydrocarbon group and an aromatic hydrocarbon group. The molar ratio of the monovalent hydrocarbon group:hydrogen in $R^2$ in the cage octasilsesquioxane as a whole is, as an average value, in the range of 6.5:1.5 to 5.5:2.5.)

In the silicone resin composition of the present invention, it is preferable that the cage octasilsesquioxane is represented by the following formula (2).

(2)

(where, in formula, $R^1$ and $R^2$ are as defined above. The molar ratio of the monovalent hydrocarbon group:hydrogen in $R^2$ is as defined above.)

In the silicone resin composition of the present invention, it is preferable that the alkenyl group-containing polysiloxane is represented by the following formula (3).

(3)

(where, in formula, $R^3$ represents a monovalent hydrocarbon group selected from a saturated hydrocarbon group and an aromatic hydrocarbon group. $R^4$ represents an alkenyl group. "a" represents an integer of 1 or more.)

In the silicone resin composition of the present invention, it is preferable that the organohydrogenpolysiloxane is a side-chain type organohydrogenpolysiloxane represented by the following formula (4) and/or a dual-end type organohydrogenpolysiloxane represented by the following formula (5).

(where, in formula, A to D represent a constituent unit, A and D represent an end unit, and B and C represent a repeating unit. $R^5$ represents a monovalent hydrocarbon group selected from a saturated hydrocarbon group and an aromatic hydrocarbon group. "b" represents an integer of 0 or more and "c" represents an integer of 1 or more.)

(where, in formula, E to H represent a constituent unit, E and H represent an end unit, and F and G represent a repeating unit. $R^6$ represents a monovalent hydrocarbon group selected from a saturated hydrocarbon group and an aromatic hydrocarbon group. "d" represents an integer of 1 or more and "e" represents an integer of 0 or more.)

In the silicone resin composition of the present invention, it is preferable that the silicone resin composition contains a silicone resin precursor obtained by allowing the cage octasilsesquioxane to react with the alkenyl group-containing polysiloxane in the presence of the hydrosilylation catalyst, and the organohydrogenpolysiloxane.

An encapsulating layer of the present invention is used so as to encapsulate an optical semiconductor element and is formed from a silicone resin composition, wherein the silicone resin composition contains a cage octasilsesquioxane having a group represented by the following formula (1), an alkenyl group-containing polysiloxane containing an alkenyl group having a number of moles larger than that of a hydrosilyl group in the cage octasilsesquioxane, a hydrosilylation catalyst, and an organohydrogenpolysiloxane.

An optical semiconductor device of the present invention includes an optical semiconductor element and an encapsulating layer which encapsulates the optical semiconductor element, wherein the encapsulating layer is formed from a silicone resin composition, and the silicone resin composition contains a cage octasilsesquioxane having a group represented by the following formula (1), an alkenyl group-containing polysiloxane containing an alkenyl group having a number of moles larger than that of a hydrosilyl group in the cage octasilsesquioxane, a hydrosilylation catalyst, and an organohydrogenpolysiloxane.

$$R^2—\underset{\underset{R^1}{|}}{\overset{\overset{R^1}{|}}{Si}}—O— \quad (1)$$

A reflector of the present invention is used so as to reflect light emitted from an optical semiconductor element and is formed from a light reflecting composition containing a silicone resin composition and a light reflecting component, wherein the silicone resin composition contains a cage octasilsesquioxane having a group represented by the following formula (1), an alkenyl group-containing polysiloxane containing an alkenyl group having a number of moles larger than that of a hydrosilyl group in the cage octasilsesquioxane, a hydrosilylation catalyst, and an organohydrogenpolysiloxane.

An optical semiconductor device of the present invention includes an optical semiconductor element and a reflector which reflects light emitted from the optical semiconductor element, wherein the reflector is formed from a light reflecting composition containing a silicone resin composition and a light reflecting component, and the silicone resin composition contains a cage octasilsesquioxane having a group represented by the following formula (1), an alkenyl group-containing polysiloxane containing an alkenyl group having a number of moles larger than that of a hydrosilyl group in the cage octasilsesquioxane, a hydrosilylation catalyst, and an organohydrogenpolysiloxane.

In the silicone resin composition of the present invention, the molar ratio of the monovalent hydrocarbon group:hydrogen in $R^2$ is within a specific range and therefore, the proportion of the hydrosilyl group in the cage octasilsesquioxane to be reacted with the alkenyl group in the alkenyl group-containing polysiloxane is adjusted. Additionally, in the silicone resin composition, the number of moles of the alkenyl group in the alkenyl group-containing polysiloxane is adjusted so as to be larger than that of the hydrosilyl group in the cage octasilsesquioxane and the organohydrogenpolysiloxane is contained therein. While the alkenyl group in the alkenyl group-containing polysiloxane is allowed to react with the hydrosilyl group in the cage octasilsesquioxane, the residual alkenyl group in the alkenyl group-containing polysiloxane is allowed to react with the hydrosilyl group in the organohydrogenpolysiloxane. Therefore, the obtained silicone resin composition can have both thermoplastic and thermosetting properties, while having an excellent transparency and heat resistance.

In addition, the silicone resin composition can reduce its thermosetting temperature.

Therefore, the encapsulating layer of the present invention made from the above-described silicone resin composition is plasticized by heating at the time of encapsulation and then, is cured at relatively low temperature, so that the encapsulating layer can encapsulate the optical semiconductor element, while effectively preventing damage thereto.

In the optical semiconductor device of the present invention, the optical semiconductor element is encapsulated by the above-described encapsulating layer, so that the optical semiconductor device can have an excellent reliability, mechanical strength, and durability, while having excellent optical characteristics and heat resistance.

The reflector of the present invention containing the above-described silicone resin composition has both thermoplastic and thermosetting properties, while having an excellent heat resistance and flexibility.

Therefore, the optical semiconductor device of the present invention including the above-described reflector has an excellent flexibility, mechanical strength, and durability, while having excellent optical characteristics and heat resistance.

DETAILED DESCRIPTION OF THE INVENTION

A silicone resin composition of the present invention contains a cage octasilsesquioxane, an alkenyl group-containing polysiloxane, a hydrosilylation catalyst, and an organohydrogenpolysiloxane.

The cage octasilsesquioxane is an octamer of trifunctional silicone monomer and to be specific, has eight groups represented by the following formula (1), (1)

(where, in formula, $R^1$ represents a monovalent hydrocarbon group selected from a saturated hydrocarbon group and an aromatic hydrocarbon group. $R^2$ represents hydrogen or a monovalent hydrocarbon group selected from a saturated hydrocarbon group and an aromatic hydrocarbon group. The molar ratio of the monovalent hydrocarbon group:hydrogen in $R^2$ in the cage octasilsesquioxane as a whole is, as an average value, in the range of 6.5:1.5 to 5.5:2.5.)

To be more specific, the cage octasilsesquioxane is represented by the following formula (2).

(2)

(where, in formula, $R^1$ and $R^2$ are the same as described above. The molar ratio of the monovalent hydrocarbon group: hydrogen in $R^2$ is the same as described above.)

In the above-described formulas (1) and (2), examples of the saturated hydrocarbon group represented by $R^1$ include a straight chain saturated hydrocarbon group (for example, an alkyl group having 1 to 6 carbon atoms such as methyl, ethyl, propyl, butyl, pentyl, and hexyl), a branched chain saturated hydrocarbon group (for example, an alkyl group having 3 to 6 carbon atoms such as isopropyl and isobutyl), and a cyclic saturated hydrocarbon group (for example, a cycloalkyl group having 3 to 6 carbon atoms such as cyclohexyl).

In the above-described formulas (1) and (2), an example of the aromatic hydrocarbon group represented by $R^1$ includes an aryl group having 6 to 8 carbon atoms such as phenyl, benzyl, and toluoyl.

The number of carbon atoms of the monovalent hydrocarbon group is, for example, 1 to 8, or preferably 1 to 6.

$R^1$s may be the same or different from each other. Preferably, $R^1$s are the same.

As the monovalent hydrocarbon group, preferably, in view of easy preparation and thermal stability, a straight chain saturated hydrocarbon group is used, more preferably, an alkyl group having 1 to 6 carbon atoms is used, or particularly preferably, methyl is used.

In the above-described formulas (1) and (2), an example of the monovalent hydrocarbon group represented by $R^2$ includes the same monovalent hydrocarbon group as that represented by $R^1$ described above. Preferably, methyl is used.

The molar ratio of the monovalent hydrocarbon group: hydrogen in $R^2$ in formula (2), in the cage octasilsesquioxane as a whole, is in the range of 6.5:1.5 to 5.5:2.5, or preferably 6.0:2.0 to 5.5:2.5 as an average value.

That is, in one molecule of the cage octasilsesquioxane, the group represented by the above-described formula (1) forms 1.5 to 2.5 (to be specific, two), or preferably 2 to 2.5 (to be specific, two) of hydrosilyl groups (—SiH).

When the above-described molar ratio of the monovalent hydrocarbon group:hydrogen in $R^2$ exceeds 6.5/1.5 (=6.5:1.5) (for example, 7/1 (=7:1), the number of moles of the hydrosilyl group is excessively small, so that the reactivity of the cage octasilsesquioxane with respect to the alkenyl-group containing polysiloxane (and the organohydrogenpolysiloxane) is significantly reduced and the molecular weight of the silicone resin composition to be obtained is reduced. Therefore, the silicone resin composition in a solid state cannot be obtained.

On the other hand, when the above-described molar ratio of the monovalent hydrocarbon group:hydrogen in $R^2$ is below 5.5/2.5 (=5.5:2.5) (for example, 5/3 (=5:3), the number of moles of the hydrosilyl group in the cage octasilsesquioxane is excessively large, so that the reactivity of the cage octasilsesquioxane with respect to the alkenyl group-containing polysiloxane (and the organohydrogenpolysiloxane) significantly increases. Therefore, the silicone resin composition does not show the thermoplastic properties.

To be specific, an example of the above-described cage octasilsesquioxane includes a cage octasilsesquioxane having methyl in $R^1$ and methyl or hydrogen in $R^2$ in the above-described formulas (1) and (2) and having a molar ratio of methyl:hydrogen in $R^2$ in the cage octasilsesquioxane as a whole of 5.5:2.5, 6:2, or 6.5:1.5 as an average value.

The cage octasilsesquioxane represented by the above-described formula (2) is synthesized by, for example, a known method (for example, in conformity with the description in Japanese Unexamined Patent Publication No. 2007-246880).

To be specific, tetraalkoxysilane (tetraethoxysilane or the like) is allowed to react with an alcohol such as methanol and/or water in the presence of a catalyst to synthesize an octa(silsesquioxane) skeleton (a portion in formula (2) excluding the groups in formula (1)) and thereafter, dialkylchlorosilane (dimethylchlorosilane or the like) and trialkylchlorosilane (trimethylchlorosilane or the like) are blended at a mixing proportion corresponding to the above-described molar ratio of the monovalent hydrocarbon group:hydrogen in $R^2$, so that an alkoxyl group (ethoxy or the like) bonded to a silicon atom of the octa(silsesquioxane) skeleton is allowed to react with dialkylchlorosilane and trialkylchlorosilane. After the reaction, a reactant is refined as required. In this way, the cage octasilsesquioxane can be obtained.

A commercially available product can be also used as the cage octasilsesquioxane.

The alkenyl group-containing polysiloxane is a polysiloxane containing an alkenyl group. To be specific, the alkenyl group-containing polysiloxane is represented by the following formula (3).

(where, in formula, $R^3$ represents a monovalent hydrocarbon group selected from a saturated hydrocarbon group and an aromatic hydrocarbon group. $R^4$ represents an alkenyl group. "a" represents an integer of 1 or more.)

The monovalent hydrocarbon groups represented by $R^3$ in formula (3) may be the same or different from each other. Preferably, the monovalent hydrocarbon groups represented by $R^3$ are the same.

An example of the monovalent hydrocarbon group represented by $R^3$ includes the same monovalent hydrocarbon group as that represented by $R^1$ in the above-described formulas (1) and (2). Preferably, methyl and phenyl are used, or more preferably, methyl is used.

Examples of the alkenyl group represented by $R^4$ in formula (3) include a substituted or unsubstituted alkenyl group. Preferably, an unsubstituted alkenyl group is used.

An example of the alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^4$s may be the same or different from each other. Preferably, $R^4$s are the same.

As the alkenyl group, preferably, in view of reactivity with the hydrosilyl group in the cage octasilsesquioxane, an alkenyl group having 2 to 5 carbon atoms is used, or more preferably, vinyl is used.

"a" represents, in view of reactivity and stability, preferably an integer of 1 to 5000, or more preferably an integer of 1 to 1000.

The number average molecular weight of the alkenyl group-containing polysiloxane represented by the above-described formula (3) is, in view of stability and handling ability, for example, 150 to 10000, or preferably 300 to 5000. The number average molecular weight of the alkenyl group-containing polysiloxane is measured with a gel permeation chromatography (GPC: calibrated with standard polystyrene).

The alkenyl group-containing polysiloxane represented by the above-described formula (3) is synthesized in accordance with, for example, a known method. A commercially available product (for example, manufactured by Gelest, Inc.) can be also used.

Examples of the hydrosilylation catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

Of the hydrosilylation catalysts, preferably, in view of compatibility and transparency, a platinum catalyst is used, or more preferably, a platinum olefin complex is used. To be specific, a platinum-divinylsiloxane complex such as a platinum-1,3-divinyl-1,1,3,3-tetramethyldisiloxane complex is used.

The hydrosilylation catalyst may be prepared as a solution in a known solvent (such as toluene).

The mixing ratio of the hydrosilylation catalyst (solid content) with respect to 100 parts by mass of the total amount of the cage octasilsesquioxane and the alkenyl group-containing polysiloxane is, for example, $1.0 \times 10^{-10}$ to 3 parts by mass, or preferably $1.0 \times 10^{-8}$ to 1 parts by mass.

The organohydrogenpolysiloxane is a polysiloxane having a hydrosilyl group (—SiH). To be more specific, the organohydrogenpolysiloxane has a straight chain structure. Examples of the organohydrogenpolysiloxane include a side-chain type organohydrogenpolysiloxane which has a hydrosilyl group in its side chain bonded to the main chain and/or a dual-end type organohydrogenpolysiloxane which has hydrosilyl groups at both ends of a molecule.

The side-chain type organohydrogenpolysiloxane is, for example, represented by the following formula (4).

(4)

(where, in formula, A to D represent a constituent unit, A and D represent an end unit, and B and C represent a repeating unit. $R^5$ represents a monovalent hydrocarbon group selected from a saturated hydrocarbon group and an aromatic hydrocarbon group. "b" represents an integer of 0 or more and "c" represents an integer of 1 or more.)

A to D constitute a side-chain type organohydrogenpolysiloxane.

The monovalent hydrocarbon groups represented by $R^5$ in formula (4) may be the same or different from each other. Preferably, the monovalent hydrocarbon groups represented by $R^5$ are the same.

An example of the monovalent hydrocarbon group represented by $R^5$ includes the same monovalent hydrocarbon group as that represented by $R^1$ in the above-described formulas (1) and (2). Preferably, methyl and phenyl are used, or more preferably, methyl is used.

"b" represents, in view of reactivity and stability, preferably an integer of 1 to 10000, or more preferably an integer of 1 to 5000.

"c" represents, in view of reactivity and stability, preferably an integer of 1 to 10000, more preferably an integer of 1 to 1000, in view of imparting flexibility to the silicone resin composition while obtaining it in a solid state at room temperature, particularly preferably an integer larger than "a", or most preferably an integer of 100 to 1000.

Examples of the side-chain type organohydrogenpolysiloxane include methylhydrogensiloxane, dimethylsiloxane-co-methylhydrogensiloxane, ethylhydrogensiloxane, and methylhydrogensiloxane-co-methylphenylsiloxane.

The number average molecular weight of the side-chain type organohydrogenpolysiloxane is, in view of stability and handling ability, for example, 200 to 100000, or preferably 200 to 80000. The number average molecular weight is measured with a gel permeation chromatography (GPC: calibrated with standard polystyrene).

The dual-end type organohydrogenpolysiloxane is, for example, represented by the following formula (5).

(5)

(where, in formula, E to H represent a constituent unit, E and H represent an end unit, and F and G represent a repeating unit. $R^6$ represents a monovalent hydrocarbon group selected from a saturated hydrocarbon group and an aromatic hydrocarbon group. "d" represents an integer of 1 or more and "e" represents an integer of 0 or more.)

E to H constitute a dual-end type organohydrogenpolysiloxane.

The monovalent hydrocarbon groups represented by $R^6$ in formula (5) may be the same or different from each other. Preferably, the monovalent hydrocarbon groups represented by $R^6$ are the same.

An example of the monovalent hydrocarbon group represented by $R^6$ includes the same monovalent hydrocarbon group as that represented by $R^1$ in the above-described formulas (1) and (2). As the monovalent hydrocarbon group, preferably, a methyl group and a phenyl group are used, or more preferably, a methyl group is used.

"d" represents, in view of reactivity and stability, preferably an integer of 1 to 10000, or more preferably an integer of 1 to 5000.

"e" represents, in view of reactivity and stability, preferably an integer of 1 or more, more preferably an integer of 1 to 10000, or particularly preferably an integer of 1 to 5000.

The dual-end type organohydrogenpolysiloxane is, for example, when "e" is 1 or more, an organopolysiloxane containing both a hydrogen atom in its side chain and hydrogen atoms at both ends, which contains a hydrogen atom in the side chain branched off from the main chain and hydrogen atoms at both ends of the main chain. To be specific, examples thereof include a methylhydrogenpolysiloxane containing hydrosilyl groups at both ends, a (dimethylpolysiloxane-co-methylhydrogenpolysiloxane) containing hydrosilyl groups at both ends, an ethylhydrogenpolysiloxane containing hydrosilyl groups at both ends, and a (methylhydrogenpolysiloxane-co-methylphenylpolysiloxane) containing hydrosilyl groups at both ends.

The dual-end type organohydrogenpolysiloxane is, for example, when "e" is 0, an organopolysiloxane containing no hydrogen atom in its side chain/containing hydrogen atoms at both ends, which does not contain a hydrogen atom in the side chain branched off from the main chain and contains hydrogen atoms at both ends of the main chain. To be specific, examples thereof include a polydimethylsiloxane containing hydrosilyl groups at both ends, a polymethylphenylsiloxane containing hydrosilyl groups at both ends, and a polydiphenylsiloxane containing hydrosilyl groups at both ends.

As the dual-end type organohydrogenpolysiloxane, preferably, an organopolysiloxane containing no hydrogen atom in its side chain/containing hydrogen atoms at both ends represented by formula (6) is used.

(6)

(where, in formula, $R^6$ represents a monovalent hydrocarbon group selected from a saturated hydrocarbon group and an aromatic hydrocarbon group. "d" represents an integer of 1 or more.)

In formula (6), $R^6$ is the same as described above and "d" is the same as described above.

The number average molecular weight of the dual-end type organohydrogenpolysiloxane is, in view of stability and/or handling ability, for example, 100 to 30000, or preferably 150 to 10000. The number average molecular weight is measured with a gel permeation chromatography (GPC: calibrated with standard polystyrene).

The organohydrogenpolysiloxanes can be used alone or in combination.

The viscosity of the organohydrogenpolysiloxane (at 25° C.) is, for example, 10 to 100000 mPa·s, or preferably 20 to 50000 mPa·s. The viscosity can be measured using a B-type viscometer.

To be specific, the content of the hydrosilyl group (—SiH) in the organohydrogenpolysiloxane is, for example, 0.01 to 20 mmol/g, or preferably 0.05 to 15 mmol/g. The content of the hydrosilyl group is calculated from the integral value of the hydrosilyl group and the methyl group with a $^1$H-NMR.

The organohydrogenpolysiloxane is, for example, synthesized in accordance with a known method. A commercially available product (for example, manufactured by Gelest, Inc., and Shin-Etsu Chemical Co., Ltd.) can be also used.

The cage octasilsesquioxane, the alkenyl group-containing polysiloxane, the hydrosilylation catalyst, and the organohydrogenpolysiloxane are blended, so that the silicone resin composition of the present invention is prepared.

The mixing ratio of the cage octasilsesquioxane with respect to the silicone resin composition is, for example, 10 to 80 mass %, or preferably 10 to 70 mass %.

The mixing proportion of the alkenyl group-containing polysiloxane is adjusted so that the number of moles of the alkenyl group in the alkenyl group-containing polysiloxane is larger than that of the hydrosilyl group in the cage octasilsesquioxane.

That is, the molar ratio (the number of moles of the alkenyl group/the number of moles of the hydrosilyl group) of the alkenyl group in the alkenyl group-containing polysiloxane to the hydrosilyl group in the cage octasilsesquioxane exceeds 1 and is, for example, 1.00001 to 10, preferably 1.0001 to 5, more preferably 1.01 to 2, or particularly preferably 1.05 to 1.5.

When the above-described molar ratio is below the above-described range, the number of moles of the alkenyl group in the alkenyl group-containing polysiloxane is smaller than that of the hydrosilyl group in the cage octasilsesquioxane and therefore, the alkenyl group disappears due to a hydrosilylation reaction of the alkenyl group in the alkenyl group-containing polysiloxane with the hydrosilyl group in the cage octasilsesquioxane. As a result, thereafter, the hydrosilylation reaction of the alkenyl group in the alkenyl group-containing polysiloxane with the hydrosilyl group in the organohydrogenpolysiloxane does not occur, that is, an addition curable reaction is not progressed. Instead, a condensation curable reaction of the residual hydrosilyl group in the cage octasilsesquioxane with the hydrosilyl group in the organohydrogenpolysiloxane is progressed, but the reaction rate thereof is significantly slow, so that the thermosetting temperature becomes high.

On the other hand, when the above-described molar ratio exceeds the above-described range, the alkenyl group excessively remains and therefore, the heat resistance of a cured product may be reduced.

The mixing ratio of the organohydrogenpolysiloxane is adjusted so that the number of moles (X) of the hydrosilyl group with respect to the number of moles (Y), which is obtained by subtracting the number of moles of the hydrosilyl group in the cage octasilsesquioxane from the number of moles of the alkenyl group in the alkenyl group-containing polysiloxane, is, as the molar ratio (X/Y), for example, $10^{-8}$ to $10^3$, preferably $10^{-6}$ to $10^2$, more preferably 0.1 to 50, particularly preferably 1 to 20, or most preferably 2 to 10. In other words, the mixing ratio of the organohydrogenpolysiloxane with respect to 100 parts by mass of the total amount of the cage octasilsesquioxane and the alkenyl group-containing polysiloxane is, for example, 0.01 to 100 parts by mass, or preferably 0.01 to 50 parts by mass.

The mixing ratio of the organohydrogenpolysiloxane with respect to the silicone resin composition as a whole is, for example, 0.01 to 50 mass %, or preferably 0.01 to 30 mass %.

In order to prepare the silicone resin composition, preferably, a silicone resin precursor, which is obtained by allowing the cage octasilsesquioxane to react with the alkenyl group-containing polysiloxane in the presence of the hydrosilylation catalyst, and the organohydrogenpolysiloxane are blended.

That is, first, the cage octasilsesquioxane is allowed to react with the alkenyl group-containing polysiloxane in the presence of the hydrosilylation catalyst at such a mixing proportion that the number of moles of the alkenyl group in the alkenyl group-containing polysiloxane is larger (excessive) than that of the hydrosilyl group in the cage octasilsesquioxane. In this way, the silicone resin precursor is obtained.

To be more specific, in order to obtain the silicone resin precursor, the above-described cage octasilsesquioxane and alkenyl group-containing polysiloxane are blended at the above-described mixing proportion, along with the hydrosilylation catalyst, and a solvent as required and thereafter, the obtained mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the alkenyl group-containing polysiloxane. That is, the hydrosilyl group in the cage octasilsesquioxane and the alkenyl group in the alkenyl group-containing polysiloxane are allowed to undergo a hydrosilylation reaction (an addition reaction, an addition of a hydrosilyl group).

The degree of the hydrosilylation reaction of the hydrosilyl group in the cage octasilsesquioxane with the alkenyl group in the alkenyl group-containing polysiloxane can be checked by $^1$H-NMR measurement based on the intensity of a signal derived from the hydrosilyl group in the cage octasilsesquioxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the alkenyl group is excessive compared with the number of moles of the hydrosilyl group. After the reaction, the excess of the alkenyl group remains.

In this way, the silicone resin precursor is obtained.

The silicone resin precursor is in a liquid state, in a semi-solid state, or in a solid state.

Next, the obtained silicone resin precursor and the organohydrogenpolysiloxane are blended at the above-described proportion. By the subsequent heating (described later), the silicone resin precursor is allowed to react with the organohydrogenpolysiloxane. The solvent is distilled off as required.

In this way, the silicone resin composition of the present invention can be obtained.

An additive can be added to the silicone resin composition at an appropriate proportion as long as it does not damage the excellent effect of the present invention. Examples of the additive include antioxidants, modifiers, surfactants, dyes,- pigments, discoloration inhibitors, ultraviolet absorbers, fillers, and phosphors.

The obtained silicone resin composition is in a solid state. The silicone resin composition in a solid state is obtained because the mobility of the alkenyl group-containing polysiloxane is reduced due to the steric hindrance of the cage octasilsesquioxane.

In the silicone resin composition of the present invention, the molar ratio of the monovalent hydrocarbon group:hydrogen in $R^2$ is within a specific range and therefore, the proportion of the hydrosilyl group in the cage octasilsesquioxane to be reacted with the alkenyl group in the alkenyl group-containing polysiloxane is adjusted. Additionally, in the silicone resin composition, the number of moles of the alkenyl group in the alkenyl group-containing polysiloxane is adjusted so as to be larger than that of the hydrosilyl group in the cage octasilsesquioxane and the organohydrogenpolysiloxane is contained therein. While the alkenyl group in the alkenyl group-containing polysiloxane is allowed to react with the hydrosilyl group in the cage octasilsesquioxane, the residual alkenyl group in the alkenyl group-containing polysiloxane is allowed to react with the hydrosilyl group in the organohydrogenpolysiloxane. Therefore, the obtained silicone resin composition can have both thermoplastic and thermosetting properties, while having an excellent transparency and heat resistance.

That is, the silicone resin composition is once plasticized (or liquefied) by the above-described heating and then, is cured by heating.

The silicone resin composition exhibits the thermoplastic properties based on an increase in mobility of the cage octasilsesquioxane and the alkenyl group-containing polysiloxane by heating.

The thermoplastic temperature of the silicone resin composition is, for example, 40 to 150° C., preferably 50 to 100° C., or more preferably 55 to 75° C. The thermoplastic temperature is the temperature at which the silicone resin composition shows the thermoplastic properties. To be specific, the thermoplastic temperature is the temperature at which the silicone resin composition in a solid state is softened by heating to be brought into a completely liquid state and is substantially the same as the softening temperature.

To be specific, the thermosetting properties of the once plasticized silicone resin composition are exhibited by allowing the alkenyl group which remains in the silicone resin precursor to react with the hydrosilyl group in the organohydrogenpolysiloxane.

To be more specific, the hydrosilylation reaction (the addition reaction, an addition of a hydrosilyl group) of the alkenyl group in the silicone resin precursor with the hydrosilyl group in the organohydrogenpolysiloxane is further progressed in the presence of the hydrosilylation catalyst to be cured.

The thermosetting temperature of the silicone resin composition is relatively low and is set to be, for example, 250° C. or less, or preferably 60 to 200° C. The thermosetting temperature is the temperature at which the silicone resin composition shows the thermosetting properties. To be specific, the thermosetting temperature is the temperature at which the plasticized silicone resin composition is cured by heating to be brought into a completely solid state.

As described above, the silicone resin composition can be cured by heating at relatively low temperature.

In the above-described embodiment, first, the silicone resin precursor is obtained. Thereafter, the silicone resin precursor and the organohydrogenpolysiloxane are blended, so that the silicone resin composition is prepared. However, the preparation method of the silicone resin composition is not limited to this. Alternatively, for example, the cage octasilsesquioxane, the alkenyl group-containing polysiloxane, the hydrosilylation catalyst, and the organohydrogenpolysiloxane are simultaneously blended to be then heated as required, so that the silicone resin composition can be prepared.

The use of the silicone resin composition is not particularly limited and the silicone resin composition can be used as, for example, an encapsulating material or a filling material of various industrial products. Preferably, the silicone resin composition can be formed as an encapsulating layer of various industrial products, to be specific, as an encapsulating layer for encapsulating an optical semiconductor element.

The optical semiconductor element is not particularly limited as long as it is an element provided in an optical semiconductor device. Examples thereof include a light emitting diode (LED), a photo diode, a photo transistor, and a laser diode. Preferably, an LED is used, or more preferably, an LED used for lighting is used.

Figure 1:
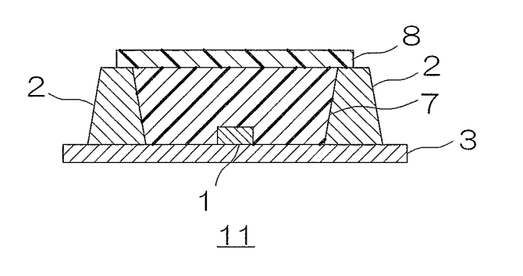
FIG. 1 shows a sectional view for illustrating one embodiment of a light emitting diode device of the present invention.

FIG. 1 shows a sectional view for illustrating one embodiment of a light emitting diode device of the present invention.

Next, one embodiment of the optical semiconductor device of the present invention is described with reference to FIG. 1.

In FIG. 1, an optical semiconductor device 11 includes a board 3, an optical semiconductor element 1 mounted on the board 3, a housing 2 formed on the board 3, an encapsulating layer 7 for encapsulating the optical semiconductor element 1, and a phosphor layer 8 formed on the encapsulating layer 7.

The board 3 is formed into a flat plate shape and is formed of a known insulating resin such as a polyimide resin.

On the upper surface of the board 3, though not shown in FIG. 1, a board-side terminal for being electrically connected to an element-side terminal in the optical semiconductor element 1 is formed.

The optical semiconductor element 1 is mounted on the board 3 and is formed of a known semiconductor material.

The element-side terminal in the optical semiconductor element 1 is electrically connected to the board-side terminal in the board 3, so that the optical semiconductor element 1 is flip-chip mounted on or is wire bonding connected to the board 3.

The housing 2 is formed into a generally frame shape in plane view and is formed into a generally trapezoidal cylinder shape in which the diameter is gradually reduced toward the upper side. The housing 2 is disposed at spaced intervals to the optical semiconductor element 1 so as to surround the optical semiconductor element 1.

The housing 2 is formed of a sintering product or the like of a ceramic material which contains a light reflecting component. The housing 2 serves as a reflector which reflects light emitted from the optical semiconductor element 1.

The encapsulating layer 7 fills inside the housing 2. To be specific, at the inner side of the housing 2, the encapsulating layer 7 covers the upper surface of the board 3 exposed from the optical semiconductor element 1, and the upper surface and the side surfaces of the optical semiconductor element 1.

The encapsulating layer 7 is formed so that the upper surface thereof is flush with the upper surface of the housing 2 in the thickness direction.

The phosphor layer 8 is formed on the entire upper surface of the encapsulating layer 7. The phosphor layer 8 is also formed in the inner side end portions on the upper surface of the housing 2.

The phosphor layer 8 is formed of a resin composition or the like which contains, for example, a phosphor particle (for example, YAG (yttrium aluminum garnet):Ce or the like). The phosphor layer 8 can be also formed by sintering a phosphor as a ceramic material.

In order to obtain the optical semiconductor device 11, first, the board 3 is prepared; then, the optical semiconductor element 1 is mounted on the board 3; and separately, the housing 2 is formed on the board 3.

Next, the encapsulating layer 7 fills inside the housing 2. To be specific, the above-described silicone resin composition fills inside the housing 2; thereafter, a solvent is distilled off as required; and then, the filled silicone resin composition is heated at the above-described temperature.

Then, the silicone resin composition is once plasticized (or liquefied) by the above-described heating to encapsulate the optical semiconductor element 1 and thereafter, the plasticized silicone resin composition is cured by heating.

Thereafter, the phosphor layer 8 is formed on the encapsulating layer 7.

In this way, the optical semiconductor device 11 is obtained.

The encapsulating layer 7 is made from the above-described silicone resin composition. Therefore, the encapsulating layer 7 is plasticized by heating at the time of encapsulation and then, is cured at relatively low temperature, so that the encapsulating layer 7 can encapsulate the optical semiconductor element 1, while effectively preventing the damage thereto caused by impact or excessive heating.

In the above-described optical semiconductor device 11, the optical semiconductor element 1 is encapsulated by the above-described encapsulating layer 7, so that the optical semiconductor device 11 can have an excellent reliability, mechanical strength, and durability, while having excellent optical characteristics and heat resistance.

In the embodiment in FIG. 1, the encapsulating layer 7 is formed from the silicone resin composition of the present invention. Alternatively, for example, the housing 2 can be formed from the silicone resin composition of the present invention.

In FIG. 1, the housing 2, as a reflector, is formed from a light reflecting composition which contains the silicone resin composition and a light reflecting component.

An example of the light reflecting component includes a white compound. To be specific, an example of the white compound includes a white pigment.

An example of the white pigment includes a white inorganic pigment. Examples of the white inorganic pigment include an oxide such as a titanium oxide, a zinc oxide, and a zirconium oxide; a carbonate such as a white lead (a lead carbonate) and a calcium carbonate; and a clay mineral such as kaolin (kaolinite).

As the white inorganic pigment, preferably, an oxide is used, or more preferably, a titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, the titanium oxide is $TiO_2$ (titanium oxide (IV), titanium dioxide).

A crystal structure of the titanium oxide is not particularly limited. For example, the crystal structure thereof is a rutile type, a brookite type (pyromelane), an anatase type (octahedrite), or the like. Preferably, the crystal structure thereof is the rutile type.

A crystal system of the titanium oxide is not particularly limited. For example, the crystal system thereof is a tetragonal system, an orthorhombic system, or the like. Preferably, the crystal system thereof is the tetragonal system.

When the crystal structure and the crystal system of the titanium oxide are the rutile type and the tetragonal system, respectively, it is possible to effectively prevent a reduction of the reflectivity with respect to light (to be specific, visible light, among all, the light around the wavelength of 450 nm) even in a case where the housing 2 is exposed to a high temperature for a long time.

The light reflecting component is in the form of a particle. The shape thereof is not limited and examples of the shape thereof include a sphere shape, a plate shape, and a needle shape. An average value of the maximum length (in the case of the sphere shape, the average particle size) of the light reflecting component is, for example, 1 to 1000 nm. The average value of the maximum length is measured using a laser diffraction scattering particle size analyzer.

The mixing ratio of the light reflecting component with respect to 100 parts by mass of the silicone resin composition is, for example, 0.5 to 90 parts by mass, or preferably, in view of coloring characteristics, light reflectivity, and handling ability of the light reflecting composition, 1.5 to 70 parts by mass.

The above-described light reflecting component is uniformly dispersed and mixed in the silicone resin composition.

The above-described silicone resin composition and light reflecting component are blended to be uniformly mixed, so that the light reflecting composition is prepared.

The housing 2 is formed from the above-described light reflecting composition into the above-described shape to be heated. The housing 2 contains the above-described silicone resin composition, so that the housing 2 has both thermoplastic and thermosetting properties, while having an excellent heat resistance and flexibility.

Therefore, the optical semiconductor device 11 including the above-described housing 2 has an excellent flexibility, mechanical strength, and durability, while having excellent optical characteristics and heat resistance.

In addition, in the optical semiconductor device 11 shown in FIG. 1, it is also possible that the encapsulating layer 7 is formed from the silicone resin composition and the housing 2 is formed from the light reflecting composition containing the silicone resin composition.

In the embodiment, the same function and effect as that described above can be achieved.

EXAMPLES

While the present invention will be described hereinafter in further detail with reference to Synthesis Examples, Comparative Synthesis Examples, Examples, and Comparative Examples, the present invention is not limited to these Synthesis Examples, Comparative Synthesis Examples, Examples, and Comparative Examples.

Synthesis Example 1

Synthesis of Cage Octasilsesquioxane 35.8 mL (160.6 mol) of tetraethoxysilane was gradually added dropwise to a liquid mixture of 66.8 mL (158.6 mol) of tetramethyl ammonium hydroxide (a 25% methanol solution), 32.8 mL of methanol, and 24.6 mL of a distilled water. The obtained mixture was stirred for a whole day to be allowed to react.

Then, the reaction liquid was filtrated and the filtrate was added dropwise to a liquid mixture of 428 mL of hexane, 7.1 g (75 mmol) of dimethylchlorosilane, and 24.4 g (225 mmol) of trimethylchlorosilane. The obtained mixture was stirred for a whole day. Thereafter, the reactant was extracted with hexane and magnesium sulfate was added to the extract to be dried. Thereafter, the hexane was once removed and then, the hexane was further added to the obtained mixture so as to cause recrystallization, so that a white and solid cage octasilsesquioxane was obtained.

It was confirmed by a $^1$H-NMR that the obtained cage octasilsesquioxane had a structure in formula (2), and $R^1$ was a methyl group and $R^2$ was hydrogen or a methyl group in formula (2). The molar ratio (an average value in the cage octasilsesquioxane as a whole) of the methyl group to the hydrogen in $R^2$ was calculated and determined to be methyl group:hydrogen=6:2.

Synthesis Example 2, and Comparative Synthesis Examples 1 and 2

Cage octasilsesquioxanes in Synthesis Example 2, and Comparative Synthesis Examples 1 and 2 were obtained in the same manner as in Synthesis Example 1, except that the mixing proportion of the dimethylchlorosilane and the trimethylchlorosilane was changed in conformity with Table 1.

It was confirmed by a $^1$H-NMR that the obtained cage octasilsesquioxane had a structure in formula (2), the groups of $R^1$ and $R^2$ in formula (2) were identified, and the molar ratio (an average value in the cage octasilsesquioxane as a whole) of the methyl group to the hydrogen in $R^2$ was calculated. The results are shown in Table 1.

The ratio (X/Y) of the hydrosilyl group (X) in the organohydrogenpolysiloxane to the residual vinyl group (Y) in the silicone resin precursor was, in molar ratio, 3.3.

Thereafter, the toluene was distilled off, so that a white turbid and solid silicone resin composition was obtained. The content ratio of the side-chain type organohydrogenpolysiloxane in the silicone resin composition was 4.4 mass %.

Example 2

A silicone resin precursor was obtained and subsequently, a white turbid and solid silicone resin composition was obtained in the same manner as in Example 1, except that the mixing amount of a side-chain type organohydrogenpolysiloxane (in formula (4), all of $R^5$s are methyl groups, "b"=510, "c"=200; a number average molecular weight of 50000, the content of SiH group of 4 mmol/g) was changed from 0.03 g to 0.14 g (21.5 parts by mass with respect to 100 parts by mass of the silicone resin precursor).

The ratio (X/Y) of the hydrosilyl group (X) in the organohydrogenpolysiloxane to the residual vinyl group (Y) in the silicone resin precursor was, in molar ratio, 15.4. The content ratio of the side-chain type organohydrogenpolysiloxane in the silicone resin composition was 17.6 mass %.

TABLE 1

| | | | Synthesis Ex. and Comp. Synthesis Ex. | | | |
|---|---|---|---|---|---|---|
| | | | Synthesis Ex. 1 | Synthesis Ex. 2 | Comp. Synthesis Ex.1 | Comp. Synthesis Ex. 2 |
| Tetraethoxysilane | Mixing | (g) | 35.8 | 35.8 | 35.8 | 35.8 |
| | Amount | (mmol) | 160.6 | 160.6 | 160.6 | 160.6 |
| Dimethylchlorosilane | Mixing | (g) | 7.1 | 8.9 | 3.5 | 10.6 |
| | Amount | (mmol) | 75 | 93.8 | 37.5 | 112.5 |
| Trimethylchlorosilane | Mixing | (g) | 24.4 | 22.4 | 28.5 | 20.4 |
| | Amount | (mmol) | 225 | 206.5 | 262.5 | 187.5 |
| Formulas (1) and (2) | | $R^1$ | Methyl Group | Methyl Group | Methyl Group | Methyl Group |
| | $R^2$ | Methyl Group:Hydrogen (Molar Ratio) | 6:2 | 5.5:2.5 | 7:1 | 5:3 |

Example 1

0.36 g of the cage octasilsesquioxane (in formula (2), all of $R^1$s are methyl groups, $R^2$ ratio=methyl group:hydrogen (molar ratio)=6:2) in Synthesis Example 1, 0.29 g of an alkenyl group-containing polysiloxane (in formula (3), all of $R^3$s are methyl groups, all of $R^4$s are vinyl groups, "a" is 8, a number average molecular weight of 800, manufactured by Gelest, Inc.), 1 g of toluene, and 0.05 µL of a platinum-divinylsiloxane complex solution (a hydrosilylation catalyst, a toluene solution, a platinum concentration of 2 mass %) were blended and the obtained mixture was stirred at 50° C. for 15 hours. In this way, a silicone resin precursor was obtained. The molar ratio (=vinyl group/hydrosilyl group) of the vinyl group in the alkenyl group-containing polysiloxane to the hydrosilyl group in the cage octasilsesquioxane was 1.11.

Thereafter, 0.03 g (4.6 parts by mass with respect to 100 parts by mass of the silicone resin precursor) of a side-chain type organohydrogenpolysiloxane (in formula (4), all of $R^5$s are methyl groups, "b"=510, "c"=200; a number average molecular weight of 50000, the content of SiH group of 4 mmol/g) was blended in the obtained silicone resin precursor to be mixed.

Example 3

A silicone resin precursor was obtained and subsequently, a white turbid and solid silicone resin composition was obtained in the same manner as in Example 1, except that 0.03 g (4.6 parts by mass with respect to 100 parts by mass of the silicone resin precursor) of a side-chain type organohydrogenpolysiloxane (in formula (4), all of $R^5$s are methyl groups, "b"=6, "c"=6; a number average molecular weight of 1000, the content of SiH group of 7 mmol/g) was blended instead of 0.03 g of a side-chain type organohydrogenpolysiloxane (in formula (4), all of $R^5$s are methyl groups, "b"=510, "c"=200; a number average molecular weight of 50000, the content of SiH group of 4 mmol/g).

The ratio (X/Y) of the hydrosilyl group (X) in the organohydrogenpolysiloxane to the residual vinyl group (Y) in the silicone resin precursor was, in molar ratio, 5.8. The content ratio of the side-chain type organohydrogenpolysiloxane in the silicone resin composition was 4.4 mass %.

Example 4

A silicone resin precursor was obtained and subsequently, a white turbid and solid silicone resin composition was obtained in the same manner as in Example 1, except that 0.03 g (5 parts by mass with respect to 100 parts by mass of the silicone resin precursor) of a dual-end type organohydrogenpolysiloxane (an organopolysiloxane containing no hydrogen atom in its side chain/containing hydrogen atoms at both ends, in formulas (5) and (6), all of $R^6$s are methyl groups, "d"=4, "e"=0; a number average molecular weight of 450, the content of SiH group of 4.4 mmol/g) was blended instead of 0.03 g of a side-chain type organohydrogenpolysiloxane (in formula (4), all of $R^5$s are methyl groups, "b"=510, "c"=200; a number average molecular weight of 50000, the content of SiH group of 4 mmol/g).

The ratio (X/Y) of the hydrosilyl group (X) in the organohydrogenpolysiloxane to the residual vinyl group (Y) in the silicone resin precursor was, in molar ratio, 3.6. The content ratio of the dual-end type organohydrogenpolysiloxane in the silicone resin composition was 4.4 mass %.

Example 5

A silicone resin precursor was obtained and subsequently, a white turbid and solid silicone resin composition was obtained in the same manner as in Example 1, except that 0.29 g of the cage octasilsesquioxane (in formula (2), all of $R^1$s are methyl groups, $R^2$ ratio=methyl group:hydrogen (molar ratio)=5.5:2.5) in Synthesis Example 2 was blended instead of 0.36 g of the cage octasilsesquioxane (in formula (2), all of $R^1$s are methyl groups, $R^2$ ratio=methyl group:hydrogen (molar ratio)=6:2) in Synthesis Example 1.

In the silicone resin precursor, the molar ratio (=vinyl group/hydrosilyl group) of the vinyl group in the alkenyl group-containing polysiloxane to the hydrosilyl group in the cage octasilsesquioxane was 1.11.

The ratio (X/Y) of the hydrosilyl group (X) in the organohydrogenpolysiloxane to the residual vinyl group (Y) in the silicone resin precursor was, in molar ratio, 3.3. The content ratio of the side-chain type organohydrogenpolysiloxane in the silicone resin composition was 4.9 mass %.

Example 6

A silicone resin precursor was obtained and subsequently, a white turbid and solid silicone resin composition was obtained in the same manner as in Example 1, except that 0.73 g of an alkenyl group-containing polysiloxane (in formula (3), all of $R^3$s are methyl groups, all of $R^4$s are vinyl groups, "a"=25; a number average molecular weight of 2000) was blended instead of 0.29 g of an alkenyl group-containing polysiloxane (in formula (3), all of $R^3$s are methyl groups, all of $R^4$s are vinyl groups, "a"=8; a number average molecular weight of 800).

In the silicone resin precursor, the molar ratio (=vinyl group/hydrosilyl group) of the vinyl group in the alkenyl group-containing polysiloxane to the hydrosilyl group in the cage octasilsesquioxane was 1.11.

The ratio (X/Y) of the hydrosilyl group (X) in the organohydrogenpolysiloxane to the residual vinyl group (Y) in the silicone resin precursor was, in molar ratio, 3.3. The content ratio of the side-chain type organohydrogenpolysiloxane in the silicone resin composition was 2.7 mass %.

Comparative Example 1

A silicone resin precursor was obtained and subsequently, a white turbid and oil-state silicone resin composition was obtained in the same manner as in Example 1, except that 0.29 g of a polysiloxane which does not contain an alkenyl group (in formula (3), all of both $R^3$s and $R^4$s are methyl groups, "a"=8; a number average molecular weight of 800) was blended instead of 0.29 g of an alkenyl group-containing polysiloxane (in formula (3), all of $R^3$s are methyl groups, all of $R^4$s are vinyl groups, "a"=8; a number average molecular weight of 800).

Comparative Example 2

A silicone resin precursor was obtained and subsequently, a white turbid and oil-state silicone resin composition was obtained in the same manner as in Example 1, except that 0.72 g of the cage octasilsesquioxane (in formula (2), all of $R^1$s are methyl groups, $R^2$ ratio=methyl group:hydrogen (molar ratio)=7:1) in Comparative Synthesis Example 1 was blended instead of 0.36 g of the cage octasilsesquioxane (in formula (2), all of $R^1$s are methyl groups, $R^2$ ratio=methyl group:hydrogen (molar ratio)=6:2) in Synthesis Example 1.

In the silicone resin precursor, the molar ratio (=vinyl group/hydrosilyl group) of the vinyl group in the alkenyl group-containing polysiloxane to the hydrosilyl group in the cage octasilsesquioxane was 1.11.

The ratio (X/Y) of the hydrosilyl group (X) in the organohydrogenpolysiloxane to the residual vinyl group (Y) in the silicone resin precursor was, in molar ratio, 3.3. The content ratio of the side-chain type organohydrogenpolysiloxane in the silicone resin composition was 2.9 mass %.

Comparative Example 3

A silicone resin precursor was obtained and subsequently, a transparent and solid (gel-like) silicone resin composition was obtained in the same manner as in Example 1, except that 0.24 g of the cage octasilsesquioxane (in formula (2), all of $R^1$s are methyl groups, $R^2$ ratio=methyl group:hydrogen (molar ratio)=5:3) in Comparative Synthesis Example 2 was blended instead of 0.36 g of the cage octasilsesquioxane (in formula (2), all of $R^1$s are methyl groups, $R^2$ ratio=methyl group:hydrogen (molar ratio)=6:2) in Synthesis Example 1.

In the silicone resin precursor, the molar ratio (=vinyl group/hydrosilyl group) of the vinyl group in the alkenyl group-containing polysiloxane to the hydrosilyl group in the cage octasilsesquioxane was 1.11.

The ratio (X/Y) of the hydrosilyl group (X) in the organohydrogenpolysiloxane to the residual vinyl group (Y) in the silicone resin precursor was, in molar ratio, 3.3. The content ratio of the side-chain type organohydrogenpolysiloxane in the silicone resin composition was 5.9 mass %.

Comparative Example 4

A silicone resin composition was obtained without obtaining a silicone resin precursor in the same manner as in Example 1, except that a platinum-divinylsiloxane complex solution (a hydrosilylation catalyst, a toluene solution, a platinum concentration of 2 mass %) was not blended. That is, an organohydrogenpolysiloxane was blended in a cage octasilsesquioxane and an alkenyl group-containing polysiloxane, so that a white turbid and oil-state silicone resin composition was obtained.

Comparative Example 5

A silicone resin precursor was obtained to be served as a silicone resin composition in the same manner as in Example 1, except that a side-chain type organohydrogenpolysiloxane (in formula (4), all of $R^5$s are methyl groups, "b"=510, "c"=200; a number average molecular weight of 50000, the content of SiH group of 4 mmol/g) was not blended. The silicone resin composition was in a white turbid and solid state.

Comparative Example 6

A white turbid and solid silicone resin composition was obtained in the same manner as in Example 1, except that the mixing amount of an alkenyl group-containing polysiloxane (in formula (3), all of $R^3$s are methyl groups, all of $R^4$s are vinyl groups, "a"=8; a number average molecular weight of 800) was changed from 0.29 g to 0.24 g.

In the silicone resin precursor, the molar ratio (=vinyl group/hydrosilyl group) of the vinyl group in the alkenyl group-containing polysiloxane to the hydrosilyl group in the cage octasilsesquioxane was 0.91.

The content ratio of the side-chain type organohydrogenpolysiloxane in the silicone resin composition was 4.7 mass %.

(Evaluation)
1. Thermoplastic Properties and Thermosetting Properties

The behavior of the silicone resin compositions at the time of heating in Examples and Comparative Examples was evaluated.

To be specific, a sample of a square of 1 cm was fabricated from the silicone resin compositions in Examples 1 to 6, and Comparative Examples 5 and 6. The sample was put on a hot plate and was heated at 30 to 200° C., so that the thermoplastic temperature and the thermosetting temperature thereof were observed visually. The results are shown in Tables 2 and 3.

The silicone resin composition in Comparative Example 3 was in a solid state, but was not softened by heating, so that the thermoplastic temperature thereof could not be evaluated. The silicone resin composition in Comparative Example 3 was in a solid state and therefore, the thermosetting temperature thereof could not be evaluated.

On the other hand, the silicone resin compositions in Comparative Examples 1, 2, and 4 were in a liquid (an oil) state, so that the thermoplastic temperature thereof could not be evaluated. A predetermined amount (about 1 mL) of the silicone resin compositions in Comparative Examples 1, 2, and 4 was applied onto a hot plate and the applied silicone resin composition was heated at 30 to 200° C. to be observed. The applied silicone resin composition was not cured by heating, so that the thermosetting temperature thereof could not be evaluated.

2. Heat Resistance (Light Transmittance)

The light transmittance of the samples in Examples 1 to 6, and Comparative Examples 5 and 6 fabricated in the same manner as described above with respect to light at the wavelength of 450 nm was measured with a spectrophotometer (U4100, manufactured by Hitachi High-Technologies Corporation).

Thereafter, the sample was placed in a hot air dryer at 200° C. for a predetermined period of time. After the elapse of 24 hours and also 168 hours, the sample was taken out from the hot air dryer and the light transmittance of the obtained sample with respect to the light at the wavelength of 450 nm was measured.

The light transmittance of the sample after the elapse of 24 hours and that of the sample after the elapse of 168 hours were evaluated. The results are shown in Tables 2 and 3.

3. Flexibility (Tensile Elastic Modulus and Coefficient of Extension)

The tensile elastic modulus and the coefficient of extension of the silicone resin compositions in Examples 1 to 6, and Comparative Examples 5 and 6 were evaluated.

To be specific, a sample having a thickness of 600 μm was fabricated from the silicone resin compositions in Examples 1 to 6, and Comparative Examples 5 and 6. Next, the sample was placed in a hot air dryer at 200° C. After the elapse of 24 hours, the sample was taken out and the tensile elastic modulus thereof at 25° C. and the coefficient of extension thereof at 25° C. were measured using a universal testing machine (autograph, manufactured by Shimadzu Corporation). The results are shown in Tables 2 and 3.

TABLE 2

| | | | Ex. 1 | Ex. 2 | Ex. 3 | Ex. 4 | Ex. 5 | Ex. 6 |
|---|---|---|---|---|---|---|---|---|
| Cage Octasilsesquioxane | | Synthesis Ex. | Synthesis Ex. 1 | Synthesis Ex. 1 | Synthesis Ex. 1 | Synthesis Ex. 1 | Synthesis Ex. 2 | Synthesis Ex. 1 |
| | | $R^2$/Methyl Group:Hydrogen (Molar Ratio) | 6:2 | 6:2 | 6:2 | 6:2 | 5.5:2.5 | 6:2 |
| | | Mixing Amount (g) | 0.36 | 0.36 | 0.36 | 0.36 | 0.29 | 0.36 |
| Alkenyl Group-Containing Polysiloxane | | $R^3$ | Methyl Group | Methyl Group | Methyl Group | Methyl Group | Methyl Group | Methyl Group |
| | | $R^4$ | Vinyl Group | Vinyl Group | Vinyl Group | Vinyl Group | Vinyl Group | Vinyl Group |
| | | Number Average Molecular Weight | 800 | 800 | 800 | 800 | 800 | 2000 |
| | | Mixing Amount (g) | 0.29 | 0.29 | 0.29 | 0.29 | 0.29 | 0.73 |
| | Hydrosilylation Catalyst | | Platinum-Divinyl-siloxane Complex Solution | Platinum-Divinyl-siloxane Complex Solution | Platinum-Divinyl-siloxane Complex Solution | Platinum-Divinyl-siloxane Complex Solution | Platinum-Divinyl-siloxane Complex Solution | Platinum-Divinyl-siloxane Complex Solution |
| Organohydrogenpolysiloxane | Side-Chain Type | $R^5$ | Methyl Group | Methyl Group | Methyl Group | — | Methyl Group | Methyl Group |
| | | Number Average Molecular Weight | 50000 | 50000 | 1000 | | 50000 | 50000 |
| | Dual-end Type | $R^6$ | — | — | — | Methyl Group | — | — |
| | | Number Average Molecular Weight | | | | 450 | | |

TABLE 2-continued

|  |  | Ex. 1 | Ex. 2 | Ex. 3 | Ex. 4 | Ex. 5 | Ex. 6 |
|---|---|---|---|---|---|---|---|
|  | Mixing Amount (g) | 0.03 | 0.14 | 0.03 | 0.03 | 0.03 | 0.03 |
|  | Proportion of Organohydrogenpolysiloxane to Silicone Resin Composition (Mass %) | 4.4 | 17.6 | 4.4 | 4.4 | 4.9 | 2.7 |
| Proportion of Hydrosilyl Group (X/Y)*[4] |  | 3.3 | 15.4 | 5.8 | 3.6 | 3.3 | 3.3 |
| Evaluation of Silicone Resin Composition | State at Room Temperature | Solid | Solid | Solid | Solid | Solid | Solid |
|  | Thermoplastic Temperature (° C.) | 60 | 55 | 60 | 60 | 70 | 56 |
|  | Thermosetting Temperature (° C.) | 81 | 78 | 70 | 85 | 80 | 72 |
|  | Heat Resistance Light Transmittance (%) 24 h | 99 | 98 | 98 | 99 | 99 | 99 |
|  | 168 h | 98 | 97 | 98 | 99 | 99 | 98 |
|  | Flexibility Tensile Elastic Modulus (MPa) | 0.28 | 0.94 | 1.12 | 0.05 | 0.33 | 0.01 |
|  | Coefficient of Extension (%) | 90 | 56 | 34 | 105 | 89 | 120 |

*[4] Proportion (X/Y) [Molar Ratio] of the hydrosilyl group in the organohydrogenpolysiloxane with respect to the residual vinyl group in the silicone resin precursor

TABLE 3

|  |  |  | Comp. Ex. 1 | Com. Ex. 2 | Comp. Ex. 3 | Comp. Ex. 4 | Comp. Ex. 5 | Comp. Ex. 6 |
|---|---|---|---|---|---|---|---|---|
| Cage Octasilsesquioxane | Synthesis Ex. And Comp. Synthesis Ex. |  | Synthesis Ex. 1 | Comp. Synthesis Ex. 1 | Comp. Synthesis Ex. 2 | Synthesis Ex. 1 | Synthesis Ex. 1 | Synthesis Ex. 1 |
|  | $R^2$/Methyl Group:Hydrogen (Molar Ratio) |  | 6:2 | 7:1 | 5:3 | 6:2 | 6:2 | 6:2 |
|  | Mixing Amount (g) |  | 0.36 | 0.72 | 0.24 | 0.36 | 0.36 | 0.36 |
| Alkenyl Group-Containing Polysiloxane | $R^3$ |  | Methyl Group | Methyl Group | Methyl Group | Methyl Group | Methyl Group | Methyl Group |
|  | $R^4$ |  | Methyl Group | Vinyl Group | Vinyl Group | Vinyl Group | Vinyl Group | Vinyl Group |
|  | Number Average Molecular Weight |  | 800 | 800 | 800 | 800 | 800 | 800 |
|  | Mixing Amount (g) |  | 0.29 | 0.29 | 0.29 | 0.29 | 0.29 | 0.24 |
| Vinyl Group/Hydrosilyl Group (Molar Ratio) |  |  | — | 1.11 | 1.11 | 1.11 | 1.11 | 0.91 |
| Hydrosilylation Catalyst |  |  | Platinum-Divinyl-siloxane Complex Solution | Platinum-Divinyl-siloxane Complex Solution | Platinum-Divinyl-siloxane Complex Solution | — | Platinum-Divinyl-siloxane Complex Solution | Platinum-Divinyl-siloxane Complex Solution |
| Organohydrogenpolysiloxane | Side-Chain Type | $R^5$ | Methyl Group | Methyl Group | Methyl Group | Methyl Group | — | Methyl Group |
|  |  | Number Average Molecular Weight | 50000 | 50000 | 50000 | 50000 |  | 50000 |
|  | Dual-end Type | $R^6$ | — | — | — | — |  | — |
|  |  | Number Average Molecular Weight |  |  |  |  |  |  |
|  | Mixing Amount (g) |  | 0.03 | 0.03 | 0.03 | 0.03 |  | 0.03 |
|  | Proportion of Organohydrogenpolysiloxane to Silicone Resin Composition (Mass %) |  | 4.4 | 2.9 | 5.9 | 4.4 |  | 4.7 |
| Proportion of Hydrosilyl Group (X/Y)*[4] |  |  | — | 3.3 | 3.3 | 3.3 | — | — |
| Evaluation of Silicone Resin Composition | State at Room Temperature |  | Liquid | Liquid | Solid | Liquid | Solid | Solid |
|  | Thermoplastic Temperature (° C.) |  | —*[1] | —*[1] | —*[2] | —*[1] | 70 | 70 |
|  | Thermosetting Temperature (° C.) |  | —*[3] | —*[3] | — | —*[3] | —*[3] | 180 |
|  | Heat Resistance Light Transmittance (%) 24 h |  | — | — | — | — | — | 99 |
|  | 168 h |  | — | — | — | — | — | 98 |
|  | Flexibility Tensile Elastic Modulus (MPa) |  | — | — | — | — | — | 0.08 |
|  | Coefficient of Extension (%) |  | — | — | — | — | — | 110 |

*[4] Proportion (X/Y) [Molar Ratio] of the hydrosilyl group in the organohydrogenpolysiloxane with respect to the residual vinyl group in the silicone resin precursor
*[1] Not evaluated because the resin was in oil state
*[2] Not plasticized
*[3] Not cured As is clear from Tables 2 and 3, the silicone resin compositions in Examples 1 to 6, and Comparative Examples 5 and 6 had both thermoplastic and thermosetting properties. Additionally, the thermosetting temperature of the silicone resin compositions in Examples 1 to 6 was 100° C. or less, which was significantly low. The extension of the silicone resin compositions in Examples 1 and 4 to 6 was excellent, and the tensile elastic modulus of the silicone resin compositions in Examples 2 and 3 was excellent.

On the other hand, the silicone resin compositions in Comparative Examples 1 to 4 did not have both of the thermoplastic properties and the thermosetting properties.

To be specific, the silicone resin composition in Comparative Example 1 did not contain the alkenyl group-containing polysiloxane, so that the hydrosilylation reaction did not occur. Therefore, the obtained silicone resin composition was not brought into a solid state at room temperature and was brought into a liquid state at room temperature. That is, the silicone resin composition in Comparative Example 1 did not have the thermoplastic properties.

The silicone resin composition in Comparative Example 2 had, as an average value, a molar ratio of the monovalent hydrocarbon group:hydrogen in $R^2$ in the cage octasilsesquioxane as a whole of 7:1. The number of moles of the hydrosilyl group in the cage octasilsesquioxane was small, so that the reactivity of the cage octasilsesquioxane and the alkenyl group-containing polysiloxane was reduced and the molecular weight of the silicone resin composition was low. Therefore, the obtained silicone resin composition was not brought into a solid state at room temperature and was brought into a liquid state at room temperature. That is, the silicone resin composition in Comparative Example 2 did not have the thermoplastic properties.

The silicone resin composition in Comparative Example 3 had, as an average value, a molar ratio of the monovalent hydrocarbon group:hydrogen in $R^2$ in the cage octasilsesquioxane as a whole of 5:3. The number of moles of the hydrosilyl group in the cage octasilsesquioxane was large, so that the obtained silicone resin composition did not show the thermoplastic properties.

The hydrosilylation catalyst was not blended in the silicone resin composition in Comparative Example 4, so that the hydrosilylation reaction did not occur and the silicone resin precursor was not obtained. Also, the silicone resin composition was not brought into a solid state at room temperature and was brought into a liquid state at room temperature. That is, the silicone resin composition in Comparative Example 4 did not have the thermoplastic properties.

The organohydrogenpolysiloxane was not blended in the silicone resin composition in Comparative Example 5 and therefore, was not cured by heating.

The silicone resin composition in Comparative Example 6 had both thermoplastic and thermosetting properties. The thermosetting temperature thereof was 200° C., which was higher than that of the silicone resin compositions in Examples 1 to 6.

It was assumed that the above-described result was obtained for the following reason: in the silicone resin precursor, the molar ratio (=vinyl group/hydrosilyl group) of the vinyl group in the alkenyl group-containing polysiloxane to the hydrosilyl group in the cage octasilsesquioxane was 0.91; the vinyl group (the alkenyl group) subjected to the hydrosilylation reaction (an addition reaction, an addition of the hydrosilyl group) with the hydrosilyl group in the organohydrogenpolysiloxane did not remain; and therefore, the hydrosilyl group which remained in the silicone resin precursor and the hydrosilyl group in the organohydrogenpolysiloxane were allowed to undergo a condensation reaction (a condensation reaction via hydrolysis), so that the curing was progressed. However, the reaction rate was slow, so that the temperature of the condensation curing was higher than that of the hydrosilylation addition curing.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A silicone resin composition comprising:
   a cage octasilsesquioxane having a group represented by the following formula (1),
   an alkenyl group-containing polysiloxane containing an alkenyl group having a number of moles larger than that of a hydrosilyl group in the cage octasilsesquioxane,
   a hydrosilylation catalyst, and
   an organohydrogenpolysiloxane (1)

(where, in the formula, $R^1$ represents a monovalent hydrocarbon group selected from a saturated hydrocarbon group and an aromatic hydrocarbon group; $R^2$ represents hydrogen or a monovalent hydrocarbon group selected from a saturated hydrocarbon group and an aromatic hydrocarbon group; the molar ratio of the monovalent hydrocarbon group:hydrogen in $R^2$ in the cage octasilsesquioxane as a whole is, as an average value, in the range of 6.5:1.5 to 5.5:2.5).

2. The silicone resin composition according to claim 1, wherein the cage octasilsesquioxane is represented by the following formula (2)

(2)

(where, in the formula, $R^1$ and $R^2$ are as defined above; the molar ratio of the monovalent hydrocarbon group:hydrogen in R2 is as defined above).

3. The silicone resin composition according to claim 1, wherein the alkenyl group-containing polysiloxane is represented by the following formula (3)

(where, in the formula, $R^3$ represents a monovalent hydrocarbon group selected from a saturated hydrocarbon group and an aromatic hydrocarbon group; $R^4$ represents an alkenyl group; "a" represents an integer of 1 or more).

4. The silicone resin composition according to claim 1, wherein the organohydrogenpolysiloxane is a side-chain type organohydrogenpolysiloxane represented by the following formula (4) and/or a dual-end type organohydrogenpolysiloxane represented by the following formula (5)

(where, in the formula, A to D represent a constituent unit, A and D represent an end unit, and B and C represent a repeating unit; $R^5$ represents a monovalent hydrocarbon group selected from a saturated hydrocarbon group and an aromatic hydrocarbon group; "b" represents an integer of 0 or more and "c" represents an integer of 1 or more;

(where, in the formula, E to H represent a constituent unit, E and H represent an end unit, and F and G represent a repeating unit; $R^6$ represents a monovalent hydrocarbon group selected from a saturated hydrocarbon group and an aromatic hydrocarbon group; "d" represents an integer of 1 or more and "e" represents an integer of 0 or more).

5. The silicone resin composition according to claim 1, wherein the silicone resin composition contains a silicone resin precursor obtained by allowing the cage octasilsesquioxane to react with the alkenyl group-containing polysiloxane in the presence of the hydrosilylation catalyst, and the organohydrogenpolysiloxane.

6. An encapsulating layer used so as to encapsulate an optical semiconductor element and formed from a silicone resin composition, wherein
the silicone resin composition comprises:
a cage octasilsesquioxane having a group represented by the following formula (1),
an alkenyl group-containing polysiloxane containing an alkenyl group having a number of moles larger than that of a hydrosilyl group in the cage octasilsesquioxane,
a hydrosilylation catalyst, and
an organohydrogenpolysiloxane (where, in the formula, $R^1$ represents a monovalent hydrocarbon group selected from a saturated hydrocarbon group and an aromatic hydrocarbon group; $R^2$ represents hydrogen or a monovalent hydrocarbon group selected from a saturated hydrocarbon group and an aromatic hydrocarbon group; the molar ratio of the monovalent hydrocarbon group:hydrogen in $R^2$ in the cage octasilsesquioxane as a whole is, as an average value, in the range of 6.5:1.5 to 5.5:2.5.

7. An optical semiconductor device comprising:
an optical semiconductor element and an encapsulating layer which encapsulates the optical semiconductor element, wherein
the encapsulating layer is formed from a silicone resin composition, and
the silicone resin composition comprises:
a cage octasilsesquioxane having a group represented by the following formula (1),
an alkenyl group-containing polysiloxane containing an alkenyl group having a number of moles larger than that of a hydrosilyl group in the cage octasilsesquioxane,
a hydrosilylation catalyst, and
an organohydrogenpolysiloxane (where, in the formula, $R^1$ represents a monovalent hydrocarbon group selected from a saturated hydrocarbon group and an aromatic hydrocarbon group; $R^2$ represents hydrogen or a monovalent hydrocarbon group selected from a saturated hydrocarbon group and an aromatic hydrocarbon group; the molar ratio of the monovalent hydrocarbon group:hydrogen in $R^2$ in the cage octasilsesquioxane as a whole is, as an average value, in the range of 6.5:1.5 to 5.5:2.5.

8. A reflector used so as to reflect light emitted from an optical semiconductor element and formed from a light reflecting composition containing
a silicone resin composition and
a light reflecting component, wherein
the silicone resin composition comprises:
a cage octasilsesquioxane having a group represented by the following formula (1),
an alkenyl group-containing polysiloxane containing an alkenyl group having a number of moles larger than that of a hydrosilyl group in the cage octasilsesquioxane, a hydrosilylation catalyst, and
an organohydrogenpolysiloxane (1)

(where, in the formula, R¹ represents a monovalent hydrocarbon group selected from a saturated hydrocarbon group and an aromatic hydrocarbon group; R² represents hydrogen or a monovalent hydrocarbon group selected from a saturated hydrocarbon group and an aromatic hydrocarbon group; the molar ratio of the monovalent hydrocarbon group:hydrogen in R² in the cage octasilsesquioxane as a whole is, as an average value, in the range of 6.5:1.5 to 5.5:2.5.

9. An optical semiconductor device comprising:
an optical semiconductor element and
a reflector which reflects light emitted from the optical semiconductor element, wherein the reflector is formed from a light reflecting composition containing
a silicone resin composition and
a light reflecting component, and
the silicone resin composition comprises:
a cage octasilsesquioxane having a group represented by the following formula (1),
an alkenyl group-containing polysiloxane containing an alkenyl group having a number of moles larger than that of a hydrosilyl group in the cage octasilsesquioxane,
a hydrosilylation catalyst, and
an organohydrogenpolysiloxane (1)

(where, in the formula, R¹ represents a monovalent hydrocarbon group selected from a saturated hydrocarbon group and an aromatic hydrocarbon group; R² represents hydrogen or a monovalent hydrocarbon group selected from a saturated hydrocarbon group and an aromatic hydrocarbon group; the molar ratio of the monovalent hydrocarbon group:hydrogen in R² in the cage octasilsesquioxane as a whole is, as an average value, in the range of 6.5:1.5 to 5.5:2.5.

* * * * *

UNITED STATES PATENT AND TRADEMARK OFFICE
CERTIFICATE OF CORRECTION

PATENT NO. : 8,810,046 B2  
APPLICATION NO. : 13/653813  
DATED : August 19, 2014  
INVENTOR(S) : Haruka Ona et al.

Page 1 of 1

It is certified that error appears in the above-identified patent and that said Letters Patent is hereby corrected as shown below:

In the Claims,

In claim 2 at column 26, line 64:

Delete "drogen in R2 is as defined above)." and insert --drogen in $R^2$ is as defined above).--

Signed and Sealed this  
Sixth Day of January, 2015

Michelle K. Lee  
*Deputy Director of the United States Patent and Trademark Office*